US005828090A

United States Patent [19]

Ugajin

[11] Patent Number: 5,828,090

[45] Date of Patent: Oct. 27, 1998

[54] CHARGE TRANSFER DEVICE

[75] Inventor: Ryuichi Ugajin, Kanagawa, Japan

[73] Assignee: Sony Corporation, Tokyo, Japan

[21] Appl. No.: 552,879

[22] Filed: Nov. 3, 1995

[30] Foreign Application Priority Data

Nov. 4, 1994 [JP] Japan .................................... 6-295742

[51] Int. Cl.[6] ..................... H01L 31/0328; H01L 31/111; H01L 29/74

[52] U.S. Cl. ........................... 257/183.1; 257/23; 257/24; 257/215

[58] Field of Search ................................. 257/14, 23, 24, 257/183.1, 215, 217, 218

[56] References Cited

U.S. PATENT DOCUMENTS 5,032,877 7/1991 Bate .
5,347,140 9/1994 Hirai et al. ................................ 257/17
5,440,148 8/1995 Nomoto .................................... 257/21
5,561,300 10/1996 Wada et al. .......................... 250/492.2

*Primary Examiner*—Ngân V. Ngô
*Attorney, Agent, or Firm*—Hill, Steadman & Simpson

[57] ABSTRACT

A charge transfer device comprises a quantum wire and a one-dimensional quantum dots array extending helically, for example, and including quantum dots which are aligned in close relation to couple with each other and to surround the quantum wire. By applying an external field within a plane normal to the quantum wire and by rotating the direction of the application of the external field, charges are transferred along the quantum wire.

13 Claims, 21 Drawing Sheets

CHARGE TRANSFER DEVICE

BACKGROUND OF THE INVENTION

1. Field of the Invention

This invention relates to a charge transfer device, in particular, of a type using a quantum structure such as quantum wires and quantum boxes (also called quantum dots).

2. Description of the Prior Art

As miniaturization of semiconductor devices progresses, it has come to be realized that the conventional scheme of operation by controlling the depletion layer through the metal wiring will see a limit in the near future. Although an object of the miniaturization is to improve characteristics of individual devices, a larger object thereof is large-scale integration. Thus the performance of semiconductor devices in the form of VLSI should be taken into consideration. Since integration of semiconductor devices into a very high density invites complex distribution of metal wiring, wiring delay has become prominent as a serious problem for both logic ICs and memory ICs.

Charge coupled devices (CCDs) had been known as one sort of semiconductor devices relying on transfer of electrons, and very-high-integrated CCDs have been accomplished and put into practice.

However, these CCDs also rely on the control of the depletion layer through the metal wiring to transfer charges, and use a number of complex extensions of metal wiring. Therefore, they also involve the serious problem of wiring delay.

Under the situation reviewed above, there is a great demand for devices capable of controlling the system not through the metal wiring. However, no such devices have been reported.

OBJECTS AND SUMMARY OF THE INVENTION

It is therefore an object of the invention to provide a charge transfer device capable of transferring charges along wires without using metal wiring.

According to the invention, there is provided a charge transfer device comprising:

at least one wire which permits charges to transfer along its lengthwise direction; and a one-dimensional quantum boxes array helically extending around the wire from one lengthwise end to the other of the wire, wherein charges are transferred along the wire by applying an external field within a plane extending across the lengthwise direction of the wire and by rotating the direction of application of the external field within the plane.

The wire used in the invention may be a quantum wire capable of one-dimensionally confining electrons, or a one-dimensional quantum boxes array in which quantum boxes capable of zero-dimensionally confining electrons are arranged adjacent to each other so as to couple with each other due to a tunneling effect.

In the present invention, typically, if the center axis lies on the z-axis of the cylindrical coordinate system (r, θ, z) and the coordinate position of the center of an arbitrary quantum box in the one-dimensional quantum boxes array is expressed $(r_n, \theta_n, z_n)$, then quantum boxes satisfying $\theta_p \neq \theta_q$ are present.

In one aspect of the invention, if the center axis of the wire lies on the z-axis of the cylindrical coordinate system (r, θ, z) and the coordinate position of the center of an arbitrary quantum box in the one-dimensional quantum boxes array is expressed $(r_n, \theta_n, z_n)$, then the one-dimensional quantum boxes array lies on a helical line expressed by equation $\theta_n = \xi z_n$ (where ξ is a constant).

In another aspect of the invention, if the center axis of the wire lies on the z-axis of the cylindrical ordinate system (r, θ, z) and the coordinate position of the center of an arbitrary quantum box in the one-dimensional quantum boxes array is expressed $(r_n, \theta_n, z_n)$, then quantum boxes satisfying $\theta_n = a_1$ $(0 \leqq n < m_1)$, $\theta_n = a_2$ $(m_1 \leqq n < m_2)$, et seq. (where $a_1$, $a_2$, et seq. are constants) are present.

In a further aspect of the invention, a plurality of wires each surrounded by the one-dimensional quantum boxes array are provided in parallel to each other.

The present invention may include or need not to include a barrier layer between the wire and the one-dimensional quantum boxes array.

In the present invention, the quantum wire and the quantum boxes are typically made of a compound semiconductor heterojunction. Usable as the compound semiconductor heterojunction is GaAs/AlGaAs heterojunction, GaAs/AlAs heterojunction, InAs/AlGaSb heterojunction, or the like. Alternatively, the quantum wire and the quantum boxes may be made of a junction of a semiconductor and an insulator. When a junction of a semiconductor and an insulator is used, the semiconductor typically comprises one or more group IV elements, and the insulator comprises a compound of a group IV element and oxygen.

In one example, the semiconductor is Si, and the insulator is $SiO_2$. An example of the semiconductor comprising two kinds of group IV element is SiC.

The charge transfer device, having any form of the structures described above according to the invention, is set up such that the electron density of the system comprising the wire and the one-dimensional quantum boxes array is lower than the electron density of the state where one electron enters in each quantum box in the one-dimensional quantum boxes array. In this state, with no external field applied, the quantum state of the wire exhibits a lower energy than that of the quantum boxes, and electrons are located in the wire.

When an external field within the plane extending across the lengthwise direction of the wire is applied, electrons are drawn from the wire to a high-potential portion (here called the first portion) in the one-dimensional quantum boxes array encircling the wire, which is opposite from the direction of application of the external field. In this case, by determining an appropriate distance and an appropriate barrier height between the quantum boxes in the one-dimensional quantum boxes array, localization of electrons in the quantum boxes in the first portion can be established, where electrons are distributed to produce a Mott insulator. Then a portion (here again called the first portion) of the wire adjacent the first portion of the one-dimensional quantum boxes array is effectively held at a low potential due to the coulomb potential by the electrons in the quantum boxes in the first portion of the one-dimensional quantum boxes array. Therefore, even if one or more electrons fail to transfer from the wire to the one-dimensional quantum boxes array, they gather in high-potential portions (herein called second portions) at opposite sides of the first portion of the wire.

Thus, in this state, if electrons are generated in the system comprising the wire and the one-dimensional quantum boxes array by using an appropriate means, then the electrons here again gather in the second portions of the wire having a lower energy. In this case, since the one-dimensional quantum boxes array is configured to helically extending around the wire from one lengthwise end to the other of the wire, first portions and second portions are produced alternately in the wire. However, since the high-potential barrier against electrons exists in the first portion due to electrons in quantum boxes in the first portion of the one-dimensional quantum boxes array, excessive electrons accumulating in the second portions, i.e. input electrons, cannot transfer to the next second portion.

In this state, the direction of the external field applied is rotated within a plane extending across the lengthwise direction of the wire. Then low-energy portions in the one-dimensional quantum boxes array relative to electrons shift from those quantum boxes to other quantum boxes, and the first portion of the one-dimensional quantum boxes array having quantum boxes with localized electrons shifts in the lengthwise direction of the wire. Responsively, the second portions of the wire, in which input electrons accumulate, also shift in the lengthwise direction of the wire. That is, by rotating the external field, charges can be transferred along the wire without using metal wiring.

Local change of the one-dimensional quantum boxes array into an insulator by the external field relies on the Mott-Stark effect. Thus given below is a brief explanation on the Mott-Stark effect.

First explained is Mott transition, a kind of metal-insulator phase transition (N. F. Mott, Philos. Mag. 6, 287(1961) and metal-insulator transition (Taylor & Francis Ltd. London, 1974)), using a Hubbard picture (J. Hubbard, Proc. Roy. Soc. (London), A276, 238(1963), A277, 237 (1963), A281, 401(1964)).

Transfer energy is a physical quantity representing mobility of an electron from a quantum box to an adjacent quantum box in a quantum boxes array, and it is abbreviated T. When interaction between electrons is not taken into consideration, transfer energy T may be regarded proportional to the bandwidth. Coulomb energy when two electrons enter in a quantum box is called on-site coulomb energy U.

Then, the energy band diagram reduced to a single electron is as shown in FIG. 1A. In FIG. 1A, the subband in the higher energy side is called upper Hubbard band (UHB), and the subband at the lower energy side is called lower Hubbard band (LHB) In the half-filled state where one electron is contained in each quantum box, when LHB and UHB are apart from each other, which means that U is large or T is small, then electrons exist only in LHB (FIG. 1B). In this state, there is a gap (Hubbard gap) against low energy excitation of an electron, and the system behaves like an insulator. On the other hand, when U becomes small or T becomes large, LHB and UHB overlap. Then an empty state is produced in a portion of LHB, and electrons of the empty state enter in UHB (FIG. 1C). As a result, the system behaves like a semi-metal. As this tendency develops, the system becomes fully metallic.

In the one-dimensional quantum boxes array comprising quantum boxes aligned in close relation, U can be increased by decreasing the size of each quantum box. Similarly, T can be decreased by increasing the distance between adjacent quantum boxes or increasing the height of the barrier between quantum boxes. Apparently, therefore, Mott transition can be brought about by adjusting T and U.

Now reviewed below is the state with one electron contained in each quantum box of the one-dimensional boxes array, that is, the half-filled state. In this case, Mott transition can be brought about by varying the ratio $\eta$=T/U between the transfer energy T between quantum boxes and the on-site coulomb energy U by applying an external field.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Figure 1A:
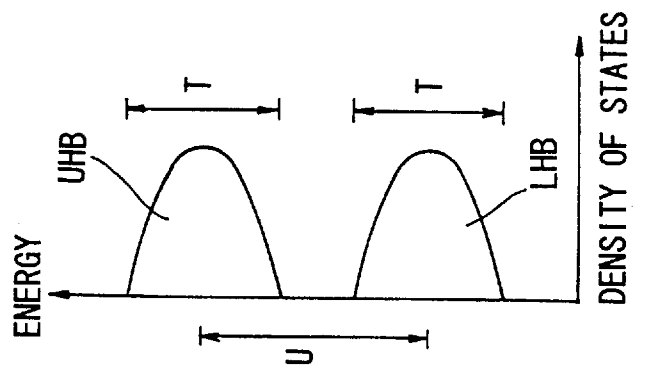
FIGS. 1A, 1B and 1C are schematic views for explaining the Mott-Stark effect.
Figure 1B:
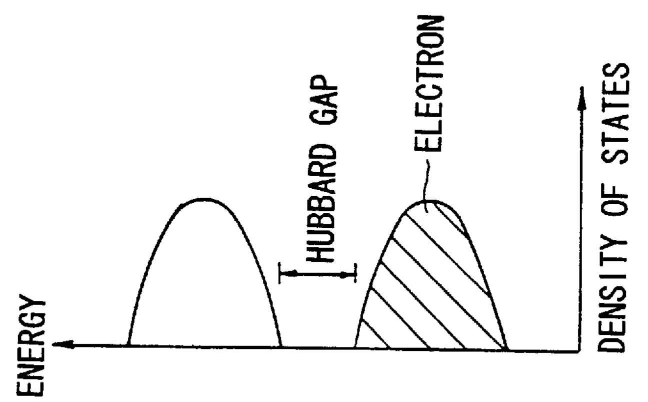
Figure 1C:
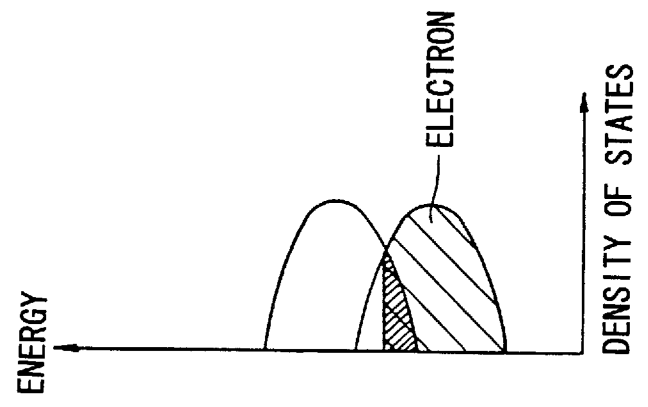

Some embodiments of the invention are explained below with reference to the drawings. In all drawings of the embodiments, the same or equivalent elements are labelled with common reference numerals.

Figure 2:
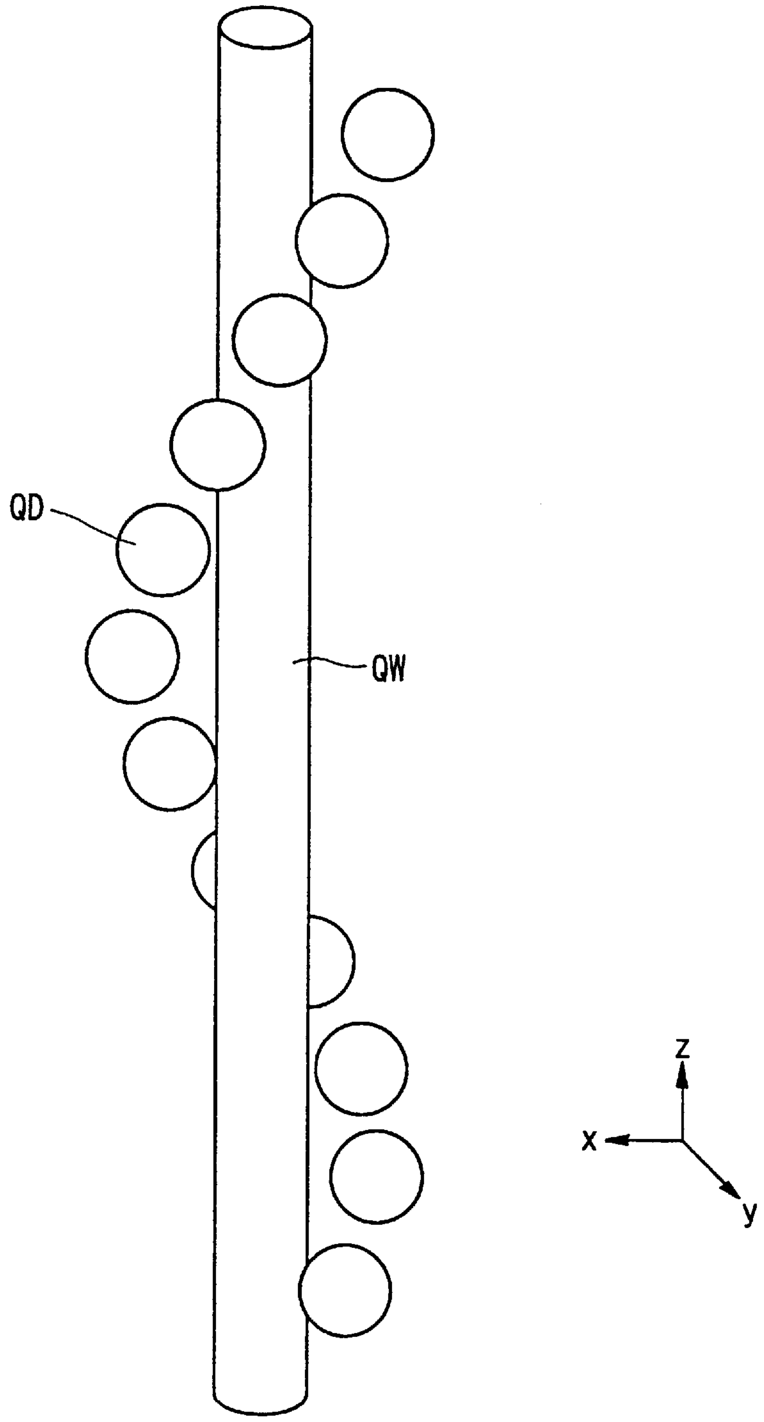
FIG. 2 is a schematic view illustrating a charge transfer device according to a first embodiment of the invention.

FIG. 2 shows a charge transfer device taken as a first embodiment of the invention.

As shown in FIG. 2, the charge transfer device according to the first embodiment includes an elongated cylindrical quantum wire QW extending in the z-axis direction. The quantum wire QW is encircled by a helical one-dimensional quantum dot array which comprises a plurality of ball-shaped quantum dots QD aligned in a contiguous relation. In this case, a barrier layer lies between the quantum dots QD of the one-dimensional quantum dot array and the quantum wire QW; however, these quantum dots QD and the quantum wire QW are near enough to permit electrons to transfer therebetween through the barrier layer due to the tunnelling effect. The electron density of the system comprising the quantum wire QW and the one-dimensional quantum dot array is held lower than the electron density of the half-filled state where one electron enters in each quantum QD of the one-dimensional quantum dot array.

Figure 3:
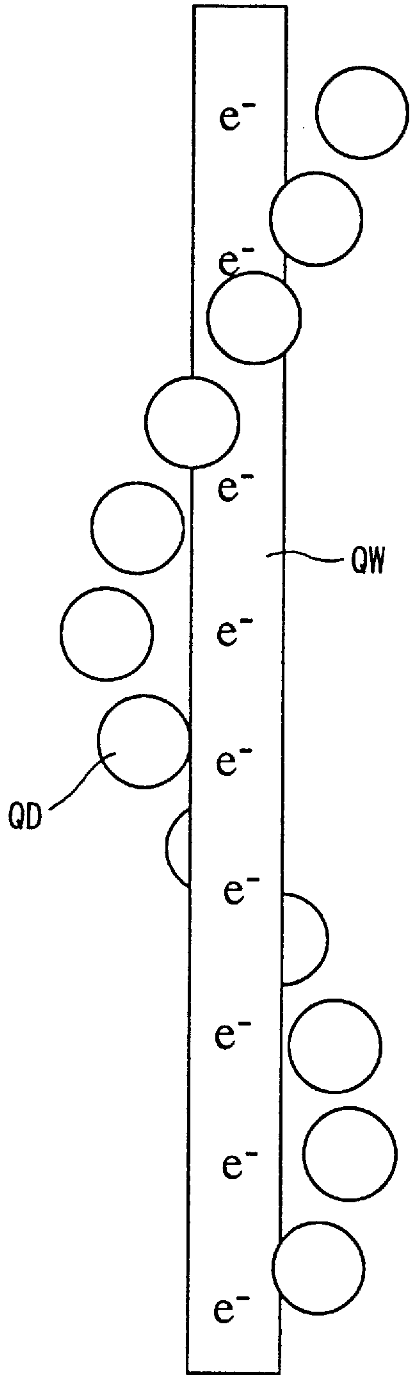
FIG. 3 is a schematic view for explaining behaviors of the charge transfer device according to the first embodiment of the invention.

Assume here that no external field is applied to the charge transfer device according to the first embodiment. In this state, since the quantum state of the quantum wire QW is lower in energy than the quantum state of the quantum dots QD, electrons ($e^{31}$) exist only in the quantum wire QW and not in the quantum dots QD as shown in FIG. 3.

Figure 4:
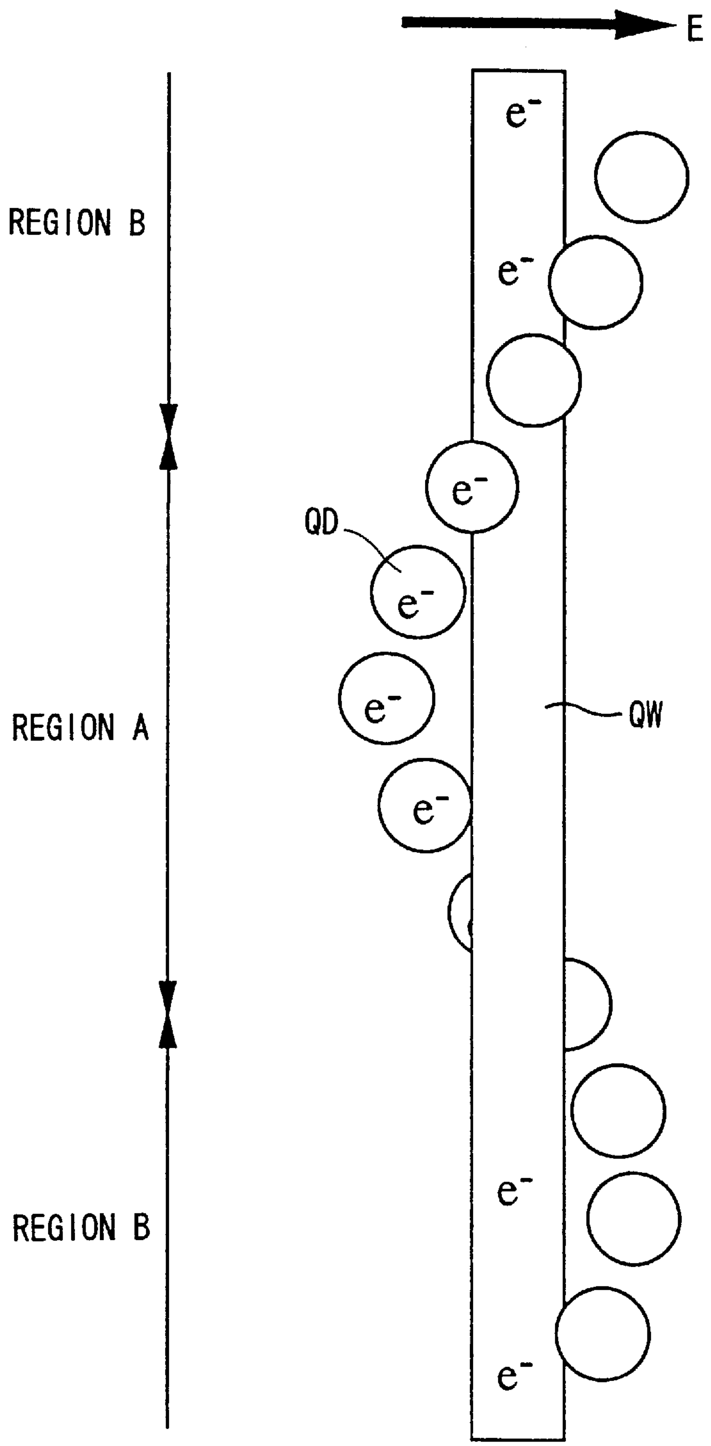
FIG. 4 is a schematic view for explaining behaviors of the charge transfer device according to the first embodiment of the invention.

Next assume that, as shown in FIG. 4, an external field E parallel to the x-y plane is applied to the charge transfer device according to the first embodiment. Due to the external field E applied, some quantum dots in a high-potential portion of the helical one-dimensional dot array, which is opposite from the direction of application of the external field E draw electrons from the adjacent portion of the quantum wire QW. Here the portion of the one-dimensional quantum dot array and the portion of the quantum wire QW where electrons are drawn from the former to the latter are called regions A, and the remainder portions of the one-dimensional quantum dot array and their adjacent portions of the quantum wire QW are called regions B.

In the helical one-dimensional quantum dot array, if the distance between respective quantum dots QD is large (5 nm or more when the height of the barrier between the quantum dots is 0.5 eV or more) or the height of the barrier between the quantum dots QD is large, attraction of electrons to the region A of the one-dimensional dot array due to the external field E produces an insulative distribution of the electrons in the quantum dots QD in the region A and hence establishes localization of electrons in the quantum dots QD in the region A. In this state, the portion of the quantum wire QW in the region A exhibits a low potential as compared to the other portions of the quantum wire QW in regions B due to the coulomb potential by electrons within the quantum dots QD in the region A of the one-dimensional quantum dot array. Therefore, even if one or more electrons fails to transfer to the quantum dots QD and remain in the quantum wire QW, they are gathered in the portions of the quantum wire QW in regions B.

From this state, electrons are input to the charge transfer device according to the first embodiment in the following manner.

Figure 5:
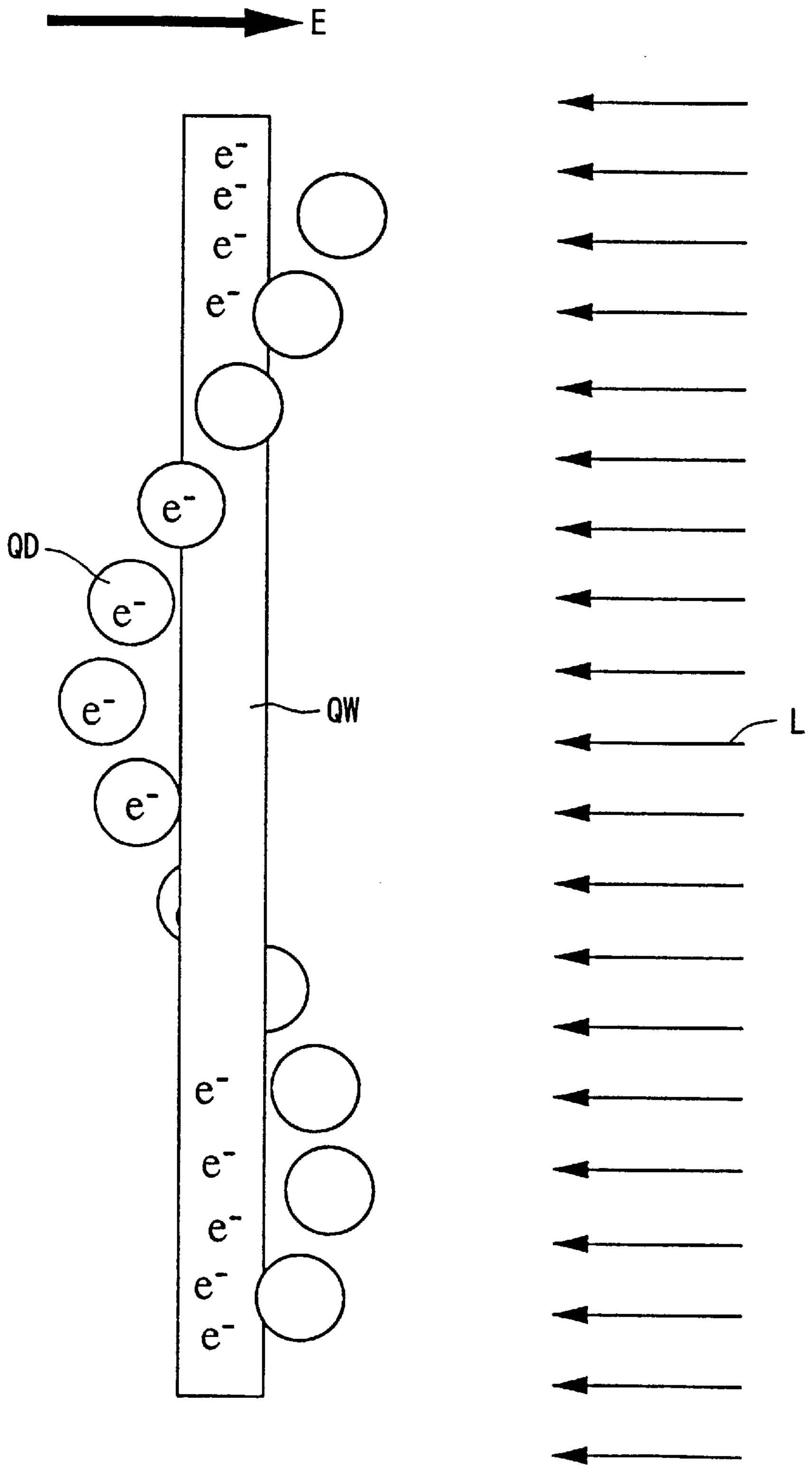
FIG. 5 is schematic view for explaining behaviors of the charge transfer device according to the first embodiment of the invention.

To introduce electrons, as shown in FIG. 5, electron-hole pairs are generated by irradiating light L, for example, to the quantum structure comprising the quantum wire QW and the one-dimensional quantum dot array while the external field E is applied. Then the holes are removed, and electrons alone are maintained. These electrons gather in regions B of the quantum wire QW where the energy is lowest in the quantum structure.

Figure 6:
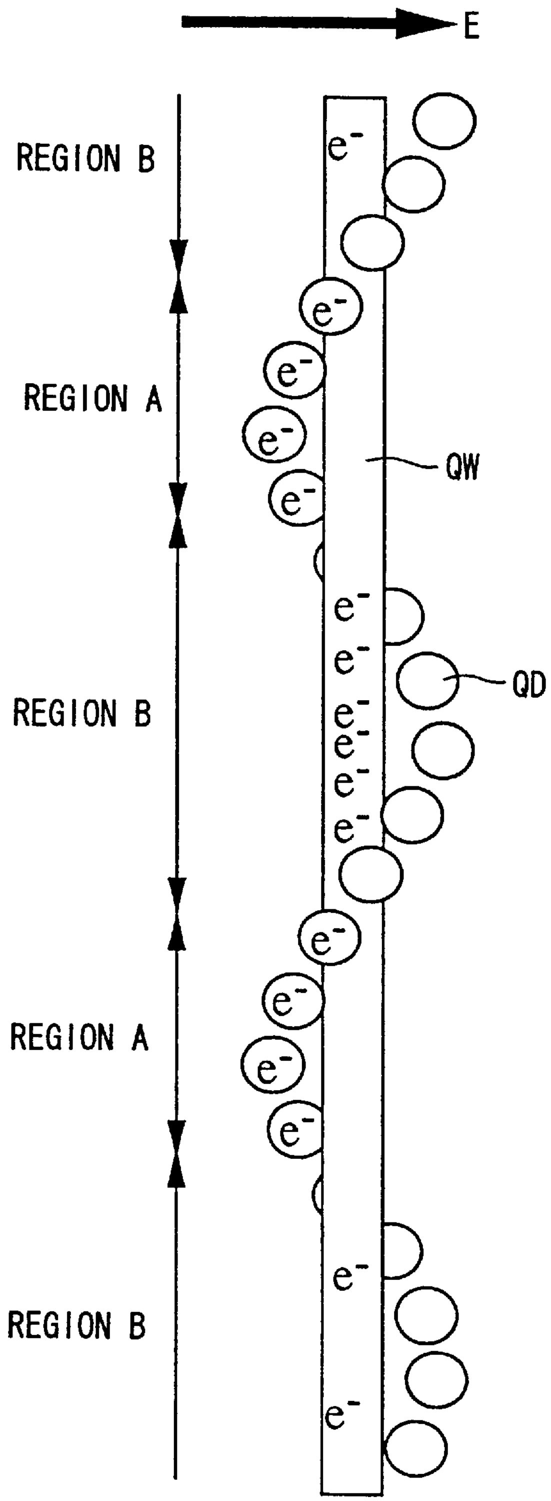
FIG. 6 is a schematic view for explaining behaviors of the charge transfer device according to the first embodiment of the invention.

In this state, since the one-dimensional quantum dot array is helical, regions A and B appear alternately as shown in FIG. 6. Since a potential barrier exists in regions A of the quantum wire QW due to localized electrons in the quantum dot QD in the region A of the one-dimensional quantum dot array, excessive electrons accumulated in regions B of the quantum wire QW (in this case, electrons generated by irradiation of light L) cannot transfer to the next regions B. In this manner, electrons are input.

Transfer of charges in the charge transfer device according to the first embodiment can be realized as follows.

Figure 7:
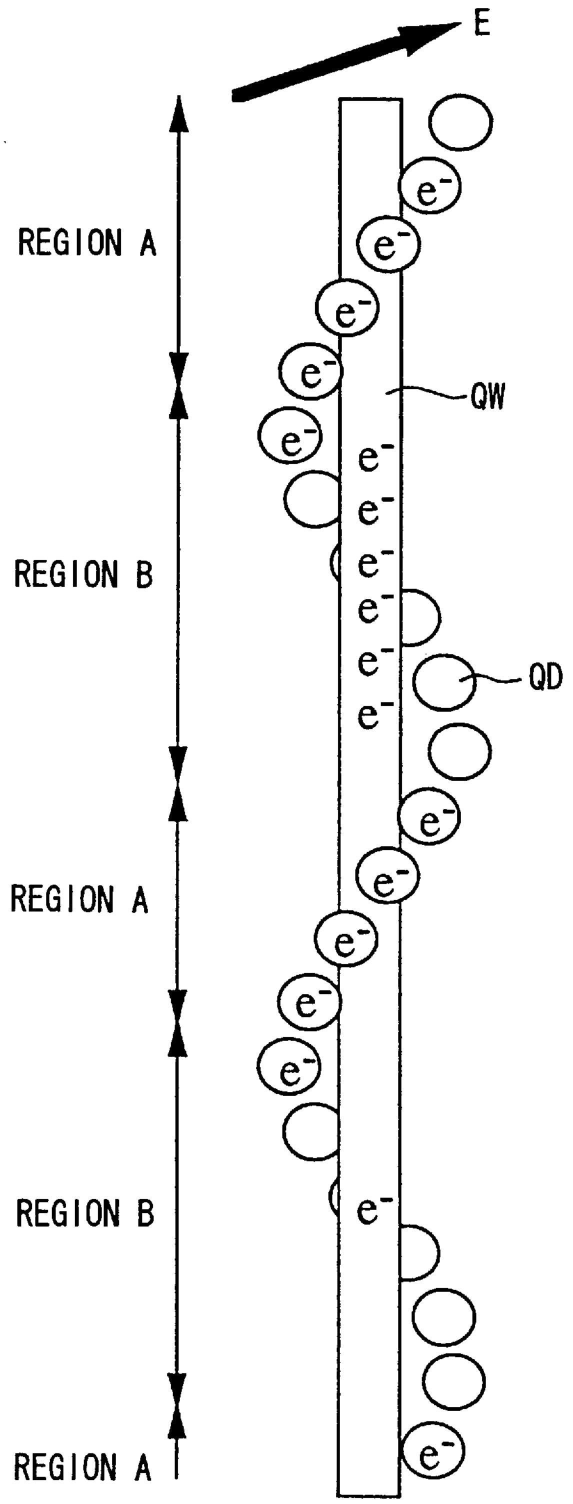
FIG. 7 is a schematic view for explaining behaviors of the charge transfer device according to the first embodiment of the invention.

Here is taken an approach where the direction of application of the external field E is rotated within the x-y plane. As shown in FIG. 7, when the direction of application of the external field E is rotated within the x-y plane, quantum dots QD exhibiting a low energy relative to electrons shift responsively, and regions A with quantum dots QD containing localized electrons shift in the z-axis direction. In this state, since adjacent quantum dots QD in the one-dimensional quantum dot array are couple with each other due to the tunneling effect, electrons can quickly transfer in the one-dimensional quantum dot array by the tunnelling effect. This is an advantage given by the use of a Mott-insulative quantum state of the coupled quantum dot array.

In response to the transfer of electrons along the one-dimensional quantum dot array, regions B of the quantum wire QW where electrons input by irradiation of light L accumulate also shift in the z-direction direction together with regions A where the coulomb barrier exists. As a result, electrons, i.e. charges, transfer in the z-direction direction along the quantum wire QW.

In this case, since the winding direction of the helical one-dimensional quantum dot array in the first embodiment is clockwise when looking the +z direction from the −z direction, the charges transfer in the +z direction when the external field E is rotated clockwise, and they transfer in the −z direction when the external field E is rotated counterclockwise. If the helical winding direction of the one-dimensional quantum dot array is counterclockwise when looking the +z direction from the −Z direction, then clockwise rotation of the external field E causes charges to transfer in the −z direction, and counterclockwise rotation of the external field E causes charges to transfer in the +z direction. The length the charges travel during one rotation of the external field E is equal to the winding pitch of the helical one-dimensional quantum dot array.

As reviewed above, the first embodiment can transfer charges along the quantum wire QW without using metal wiring, by providing the helical one-dimensional quantum dot array to encircle the quantum wire QW extending in the z-axis direction, applying the external field E within the x-y plane to the quantum structure comprising the quantum wire QW and the one-dimensional quantum dot array, and rotating the direction of application of the external field E within the x-y plane.

Figure 8:
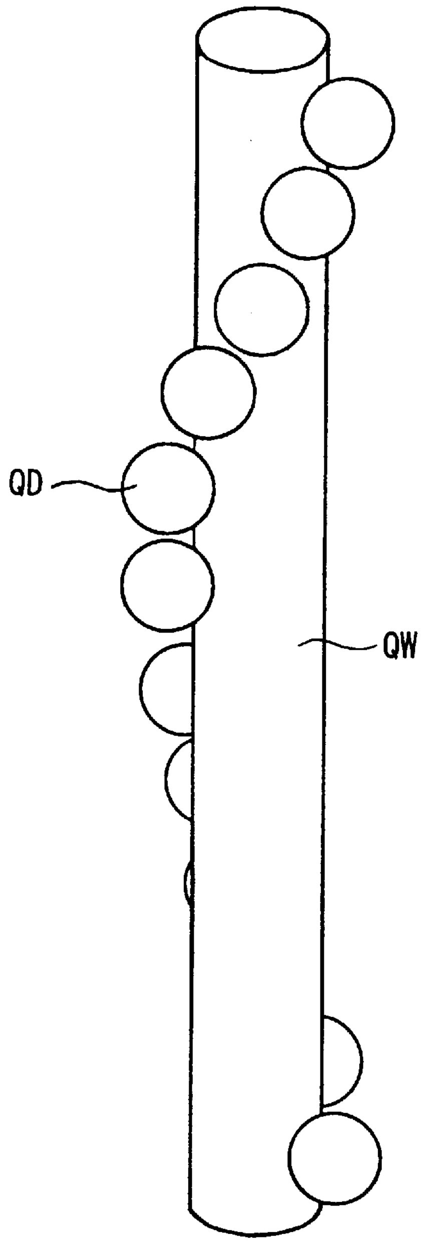
FIG. 8 is a schematic view illustrating a charge transfer device according to a second embodiment of the invention.

FIG. 8 shows a charge transfer device taken as a second embodiment of the invention.

As shown in FIG. 8, the charge transfer device according to the second embodiment is different from the charge transfer device according to the first embodiment in that the helical one-dimensional quantum dot array encircles the quantum wire QW in contact with the outer surface of the quantum wire QW with no barrier layer interposed between the quantum dots QD of the one-dimensional quantum dot array and the quantum wire QW.

Also the second embodiment produces advantages equivalent to those of the first embodiment.

Figure 9:
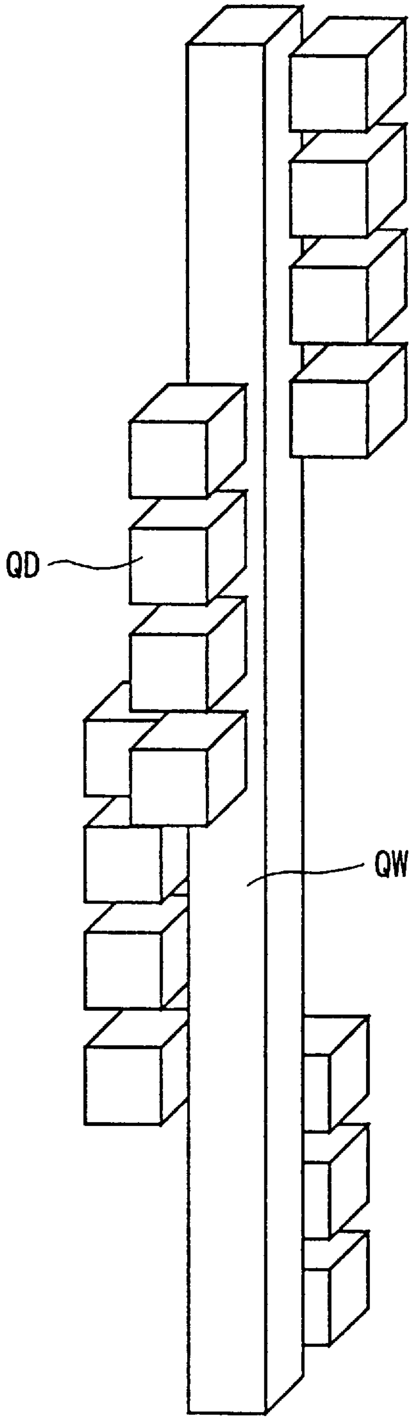
FIG. 9 is a schematic view illustrating a charge transfer device according to a third embodiment of the invention.

FIG. 9 shows a charge transfer device taken as a third embodiment of the invention.

As shown in FIG. 9, the charge transfer device according to the third embodiment includes a quadrangular-prismatic quantum wire QW elongated in the z-axis direction, and a one-dimensional quantum dot array comprising cubic quantum dots QD which are adjacent to each other and closely surround the quantum wire Qw.

In this case, assuming a cylindrical coordinate system (r, θ, z) in which the extending direction of the quantum wire QW is put on the z-axis, coordinate positions of centers of the quantum dots QD satisfy $\theta_n=a_1$ ($0\leqq n<m_1$), $\theta_n=a_2$ ($m_1\leqq n<m_2$), et seq. (where $a_1$, $a_2$, et seq. are constants). More specifically, coordinate positions of the quantum dots QD change step by step for every four contiguous quantum dots, such as $\theta_n=0°$, $\theta_n=90°$, $\theta_n=180°$, $\theta_n=270°$ and $\theta_n=360°$ ($\equiv 0°$).

According to the third embodiment, since the one-dimensional quantum dot array is not helical but so configured that the quantum dots QD are aligned to vary $\theta_n$ by 90° for every four quantum dots QD, the process for fabricating the charge transfer device is easy.

Next explained is a fourth embodiment of the invention directed to a specific structure of the charge transfer device. The charge transfer device according to the fourth embodiment is similar in structure to the charge transfer device according to the third embodiment, but different from it in that the quantum dots are cylindrical and that the one-dimensional dot array winds around the quantum wire QW in the opposite direction.

FIGS. 10 to 19 show a process for fabricating the charge transfer device according to the fourth embodiment.

Figure 10:
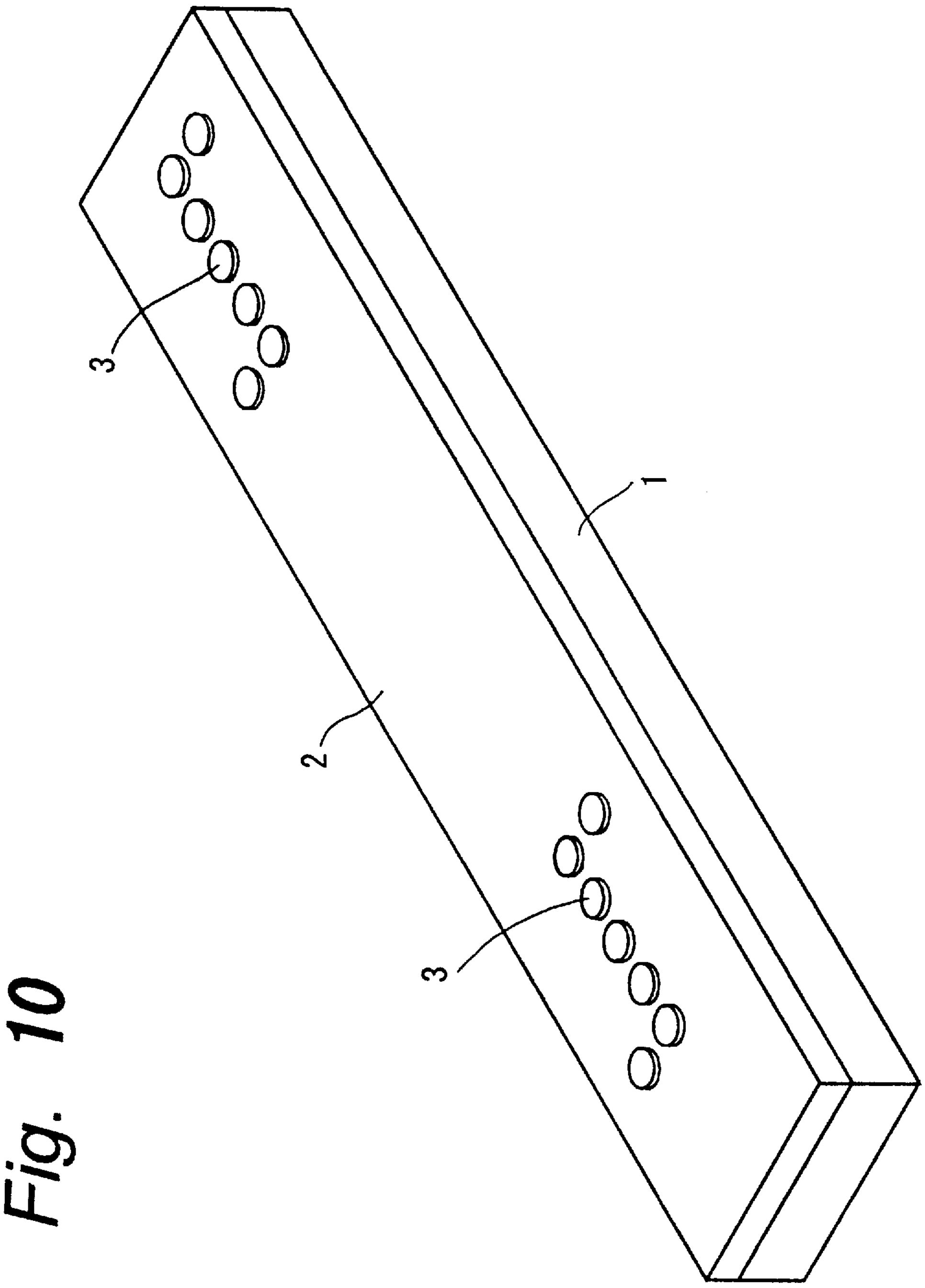
FIG. 10 is a perspective view for explaining a method for fabricating a charge transfer device according to a fourth embodiment of the invention.

As shown in FIG. 10, first made on an AlGaAs substrate 1 is a GaAs layer 2 by epitaxial growth using, for example, metallorganic chemical vapor deposition (MOCVD). The GaAs layer 2 is 10 nm thick, approximately. Next made on the GaAs layer 2 is a resist pattern 3 of circles, for example, by electron beam lithography.

Figure 11:
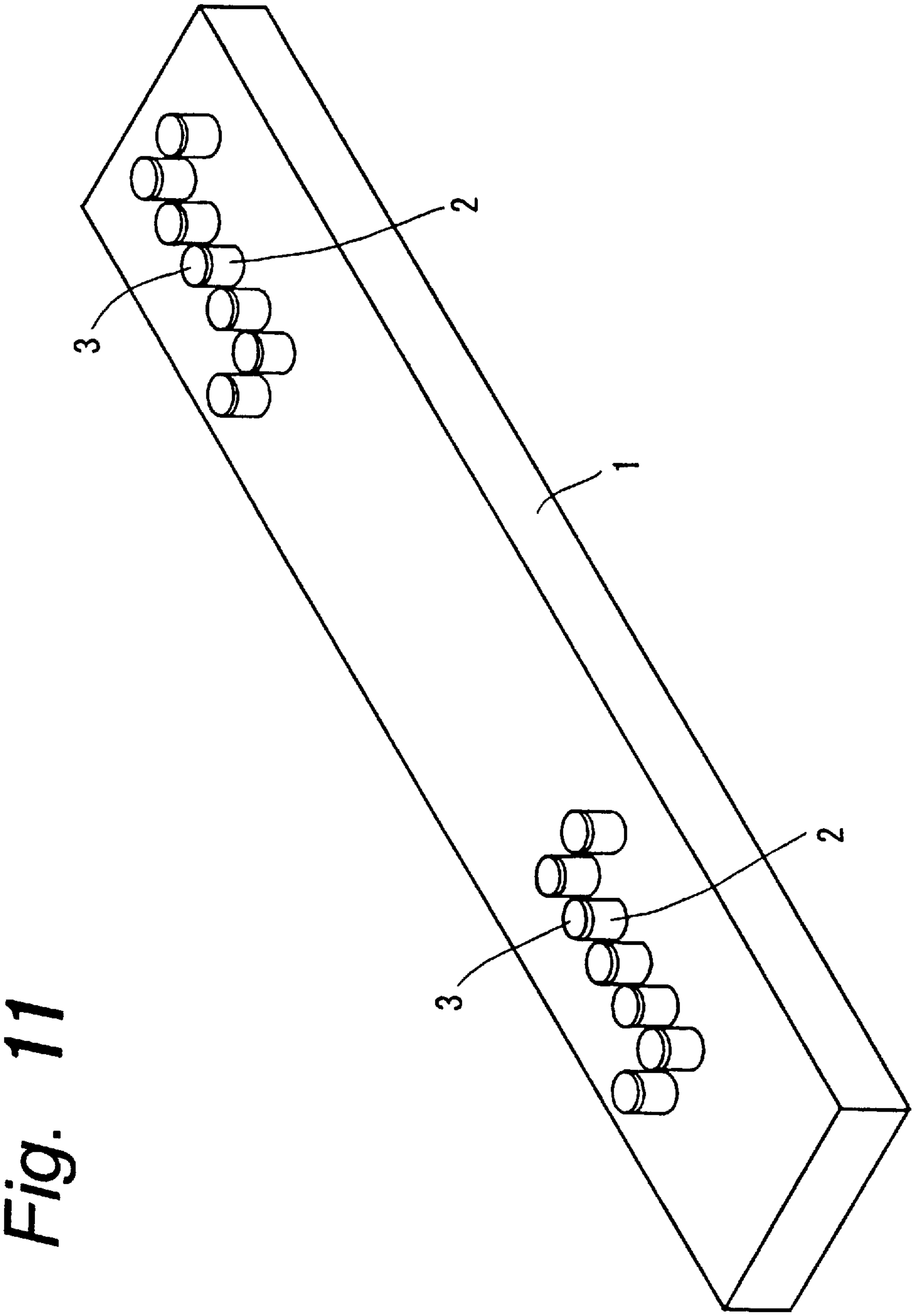
FIG. 11 is a perspective view for explaining the method for fabricating the charge transfer device according to the fourth embodiment of the invention.

Then by using the resist pattern 3 as a mask, the GaAs layer 2 is selectively etched off by, for example, reactive ion etching (RIE) in the direction normal to the substrate surface. If a chlorine-based gas is used as reactive gas in the etching by RIE, then the GaAs layer 2 can be selectively etched off by using the AlGaAs substrate 1 as an etching stop layer. Then the GaAs layer 2 is patterned into cylinders as shown in FIG. 11.

Figure 12:
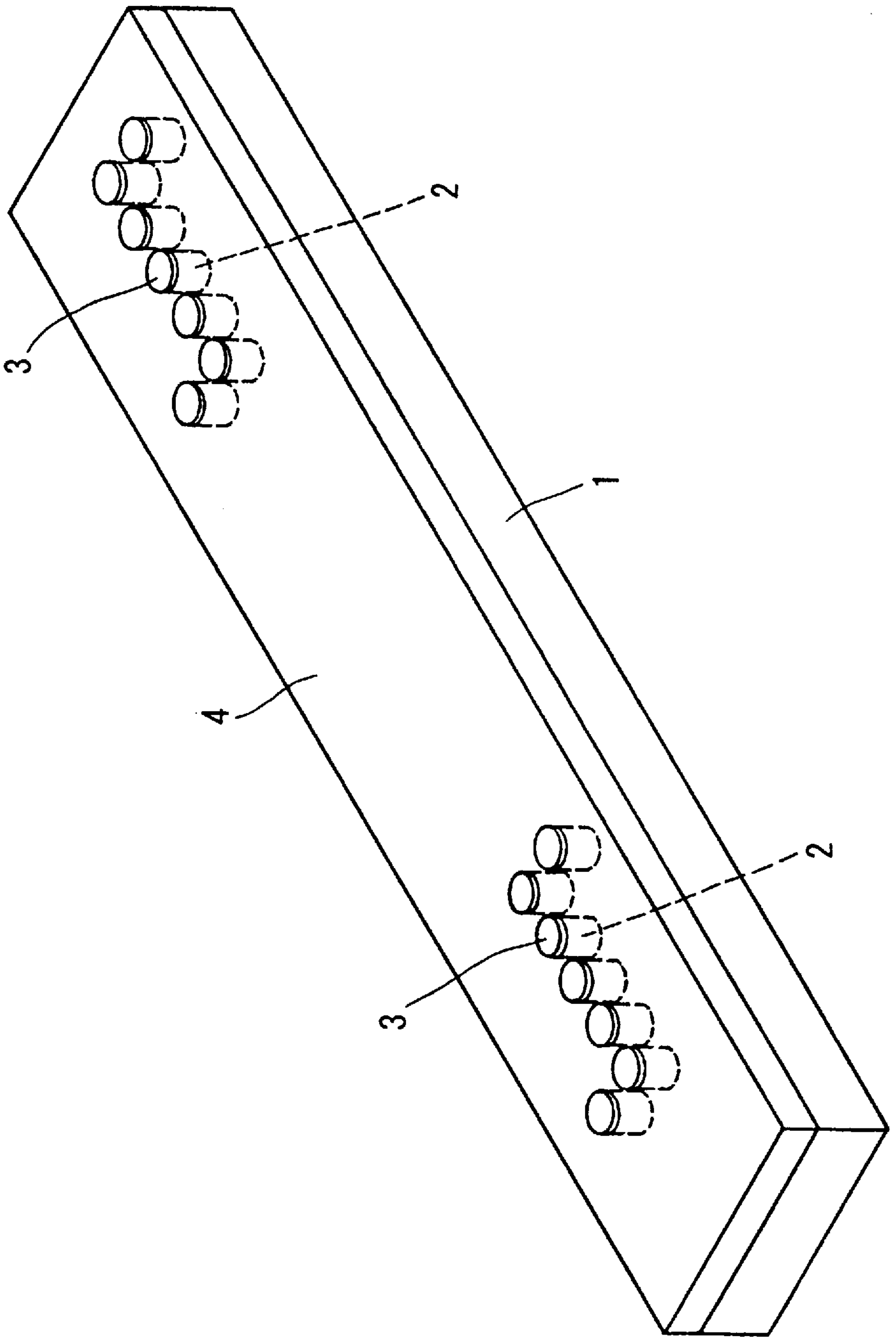
FIG. 12 is a perspective view for explaining the method for fabricating the charge transfer device according to the fourth embodiment of the invention.

Next formed is an AlGaAs layer 4 by epitaxial growth using MOCVD, for example, so as to fill the portion removed by the etching, as shown in FIG. 12.

Figure 13:
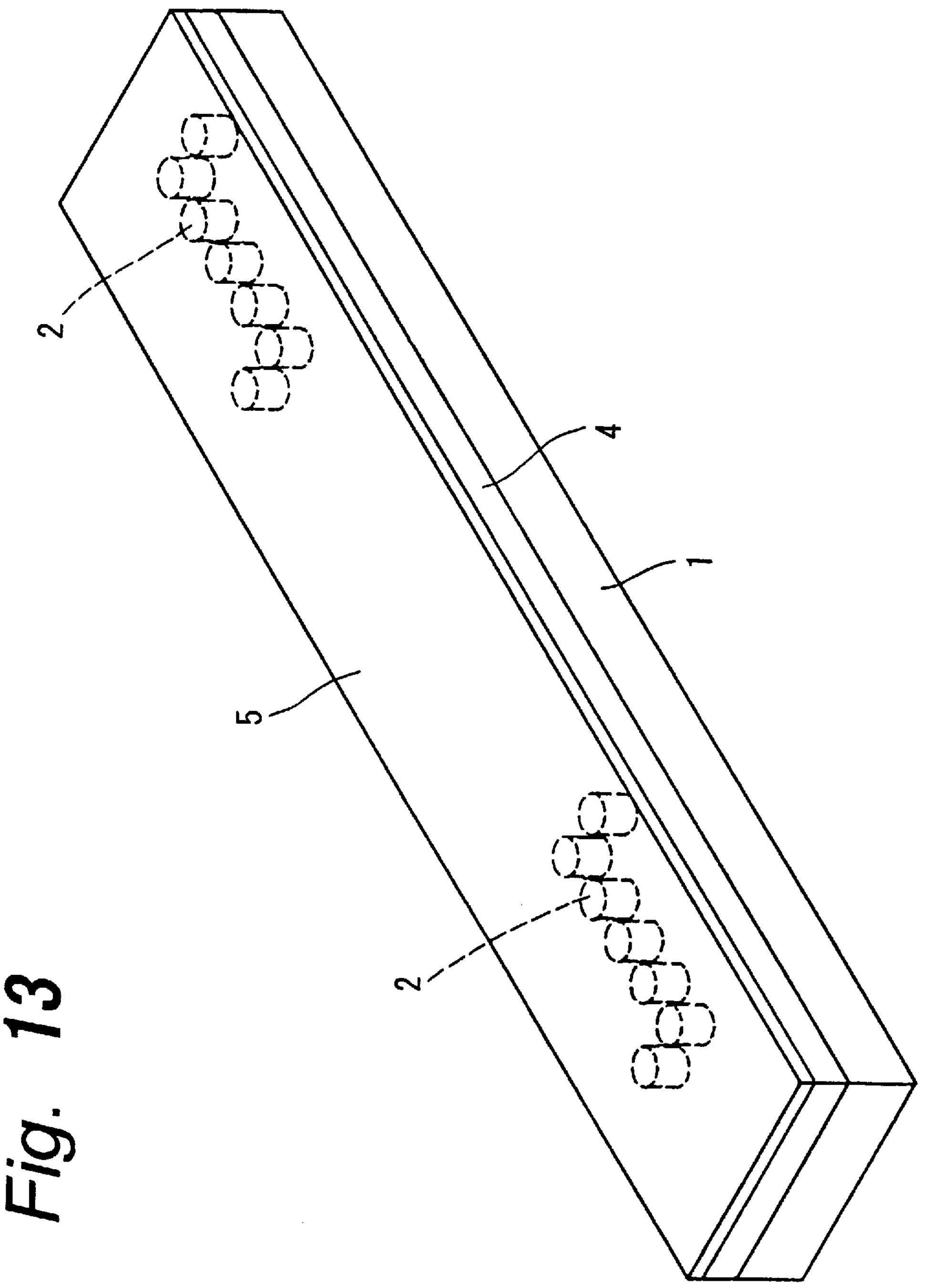
FIG. 13 is a perspective view for explaining the method for fabricating the charge transfer device according to the fourth embodiment of the invention.

After the resist pattern 3 is removed, an AlGaAs layer 5 is epitaxially grown on the entire surface by MOCVD, for example, as shown in FIG. 13. The thickness of the AlGaAs layer 5 is, for example, about 5 nm.

Figure 14:
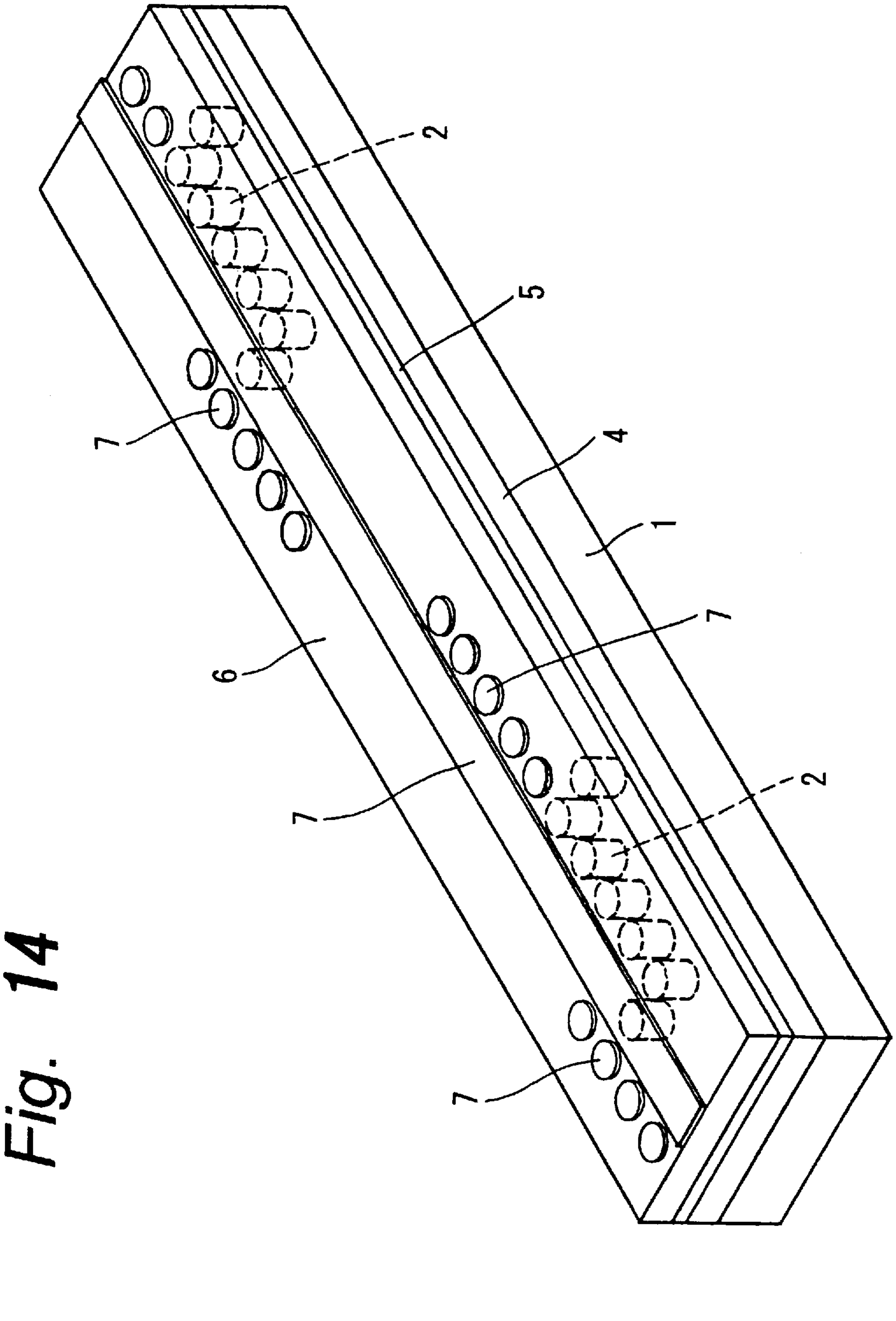
FIG. 14 is a perspective view for explaining the method for fabricating the charge transfer device according to the fourth embodiment of the invention.

Next formed on the entire surface is a GaAs layer 6 by epitaxial growth using MOCVD, for example, as shown in FIG. 14. The thickness of the GaAs layer 6 is, for example, about 10 nm. After that, a resist pattern 7 with circles and thin line is applied on the GaAs layer 6 by electron beam lithography.

Figure 15:
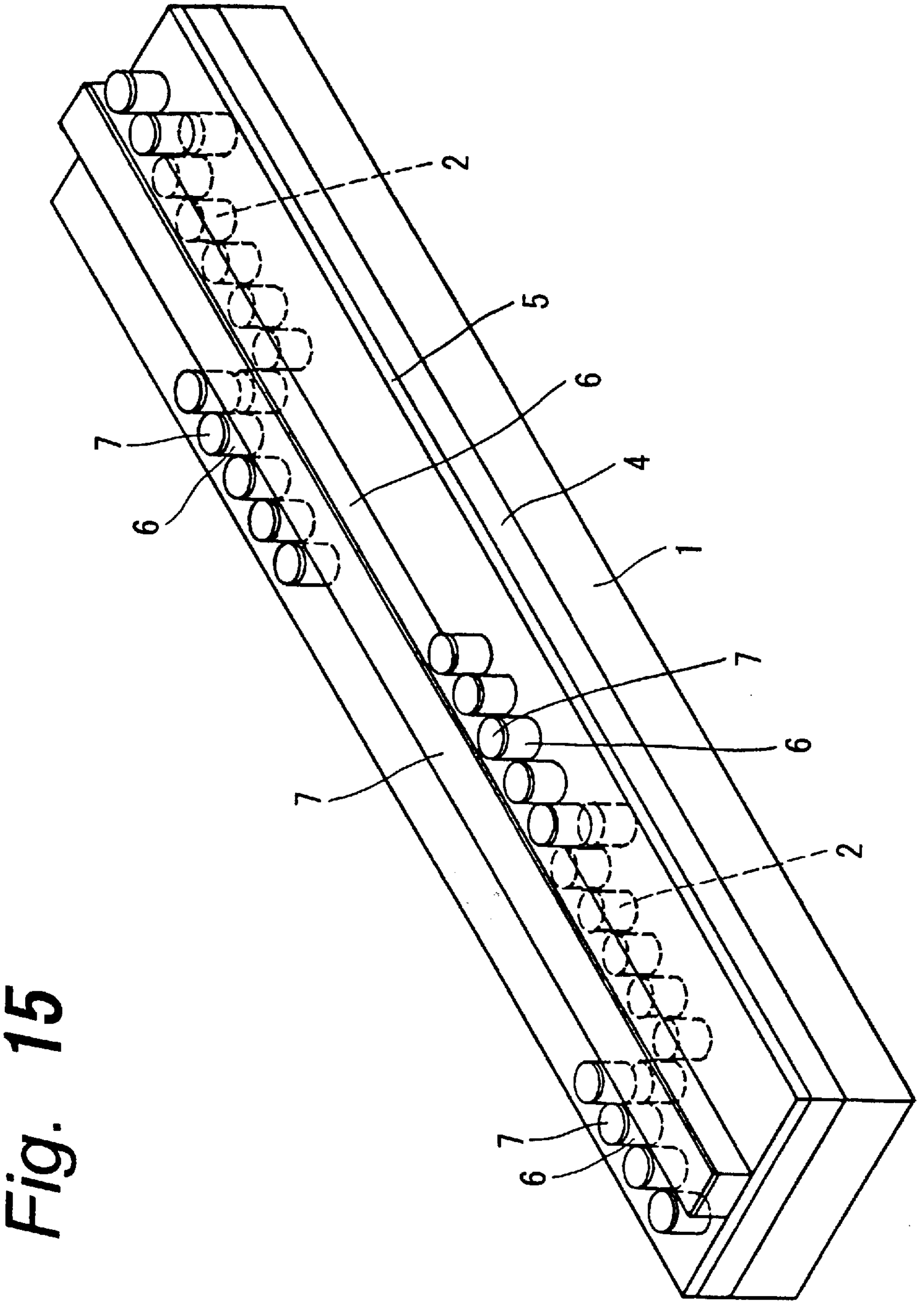
FIG. 15 is a perspective view for explaining the method for fabricating the charge transfer device according to the fourth embodiment of the invention.

By using the resist pattern 7 as a mask, the GaAs layer 6 is etched in the direction normal to the substrate surface by RIE, for example. If a chlorine-based gas is used as reactive gas in the etching by RIE, then the GaAs layer 6 can be selectively etched off by using the AlGaAs layer 5 as an etching stop layer. Thus the GaAs layer 6 is patterned into cylinders and a thin line, as shown in FIG. 15.

Figure 16:
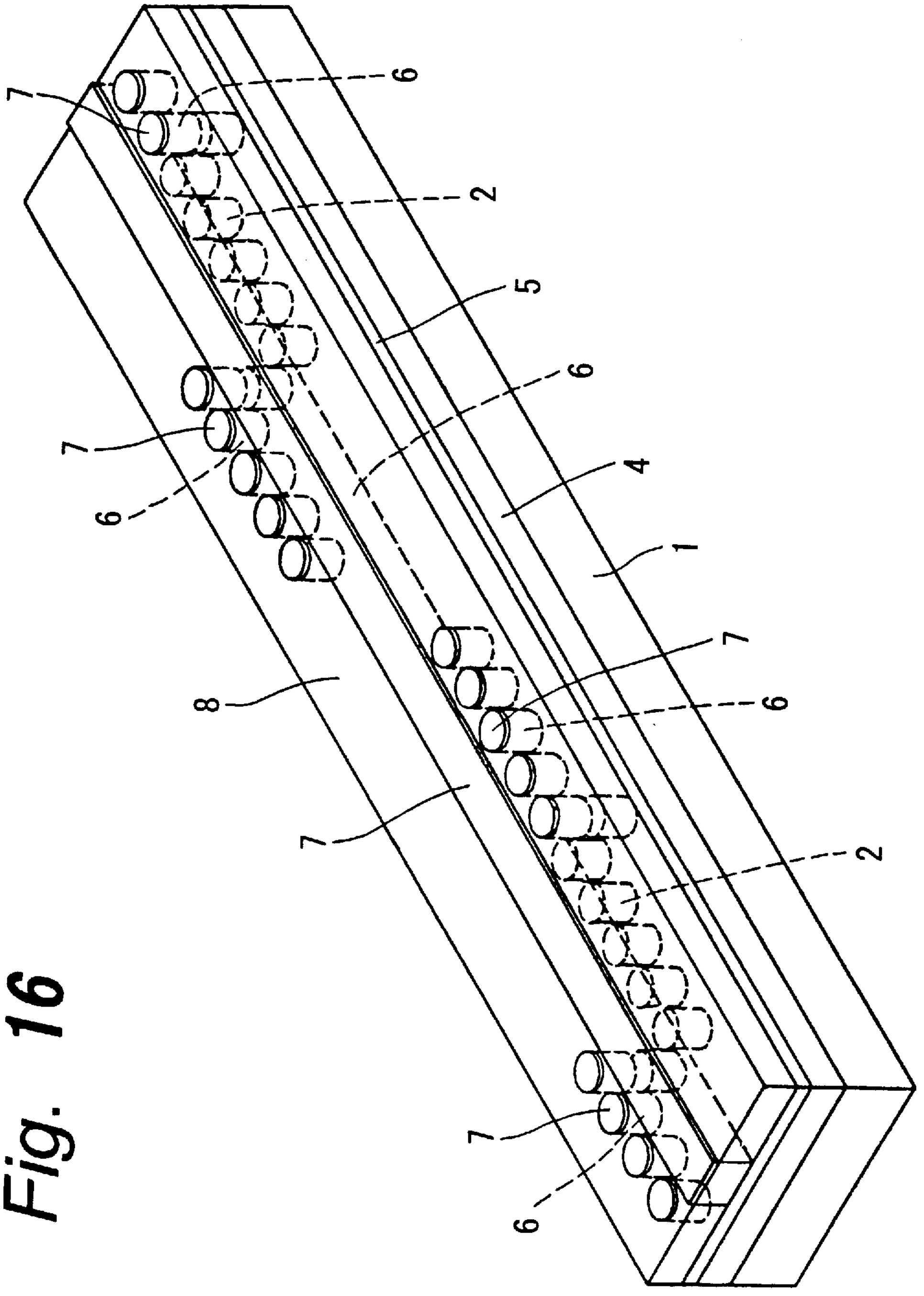
FIG. 16 is a perspective view for explaining the method for fabricating the charge transfer device according to the fourth embodiment of the invention.

Next formed is an AlGaAs layer 8 by epitaxial growth using MOCVD, for example, so as to fill the portion removed by the etching, as shown in FIG. 16.

Figure 17:
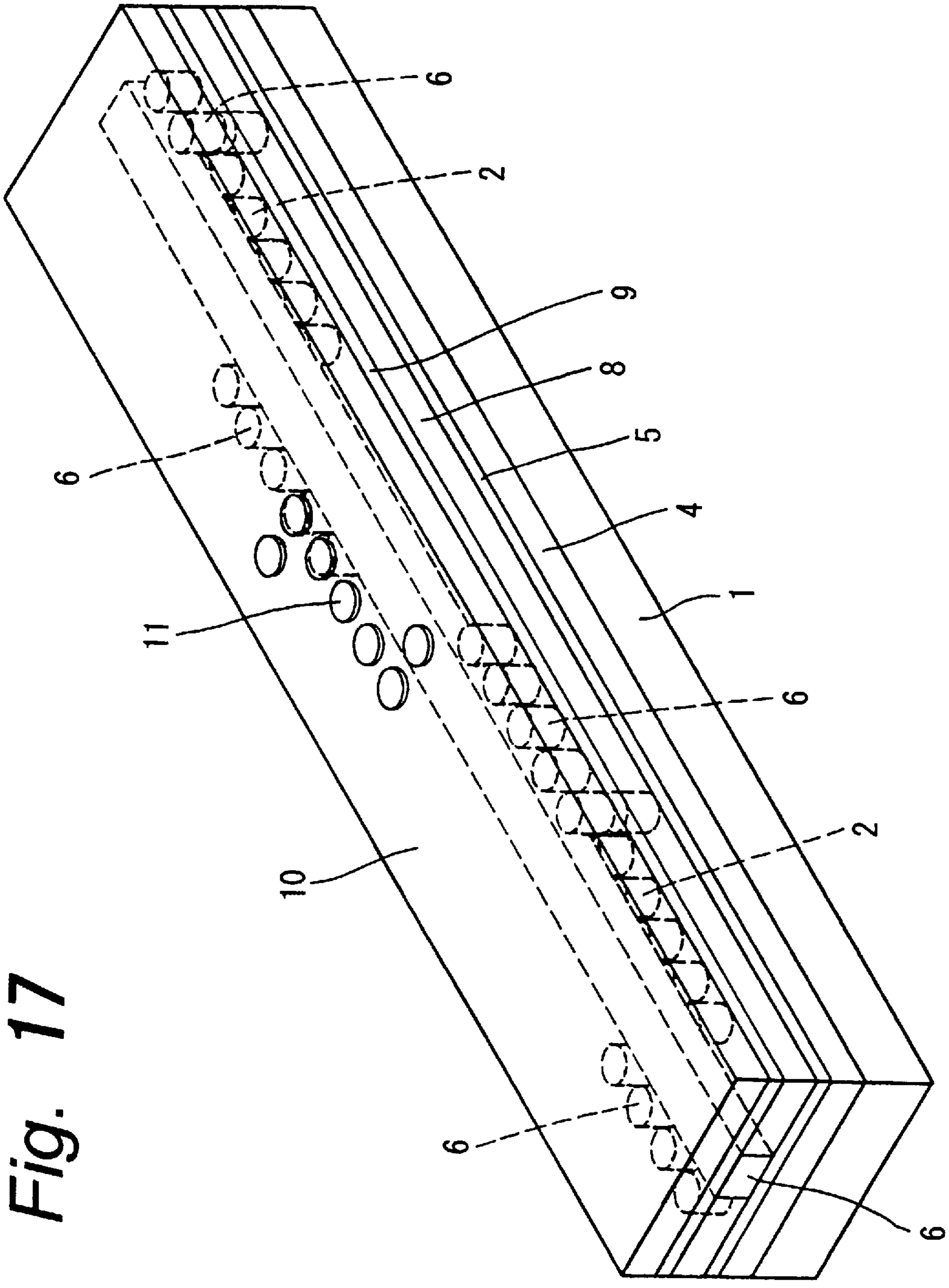
FIG. 17 is a perspective view for explaining the method for fabricating the charge transfer device according to the fourth embodiment of the invention.

After the resist pattern 7 is removed, An AlGaAs layer 9 and a GaAs layer 10 are epitaxially grown sequentially on the entire surface by MOCVD, for example, as shown in FIG. 17. The AlGaAs layer 9 may be about 5 nm thick, and the GaAs layer 10 may be about 10 nm thick. After that, a resist pattern 11 with circles is applied on the GaAs layer 10 by electron beam lithography.

Figure 18:
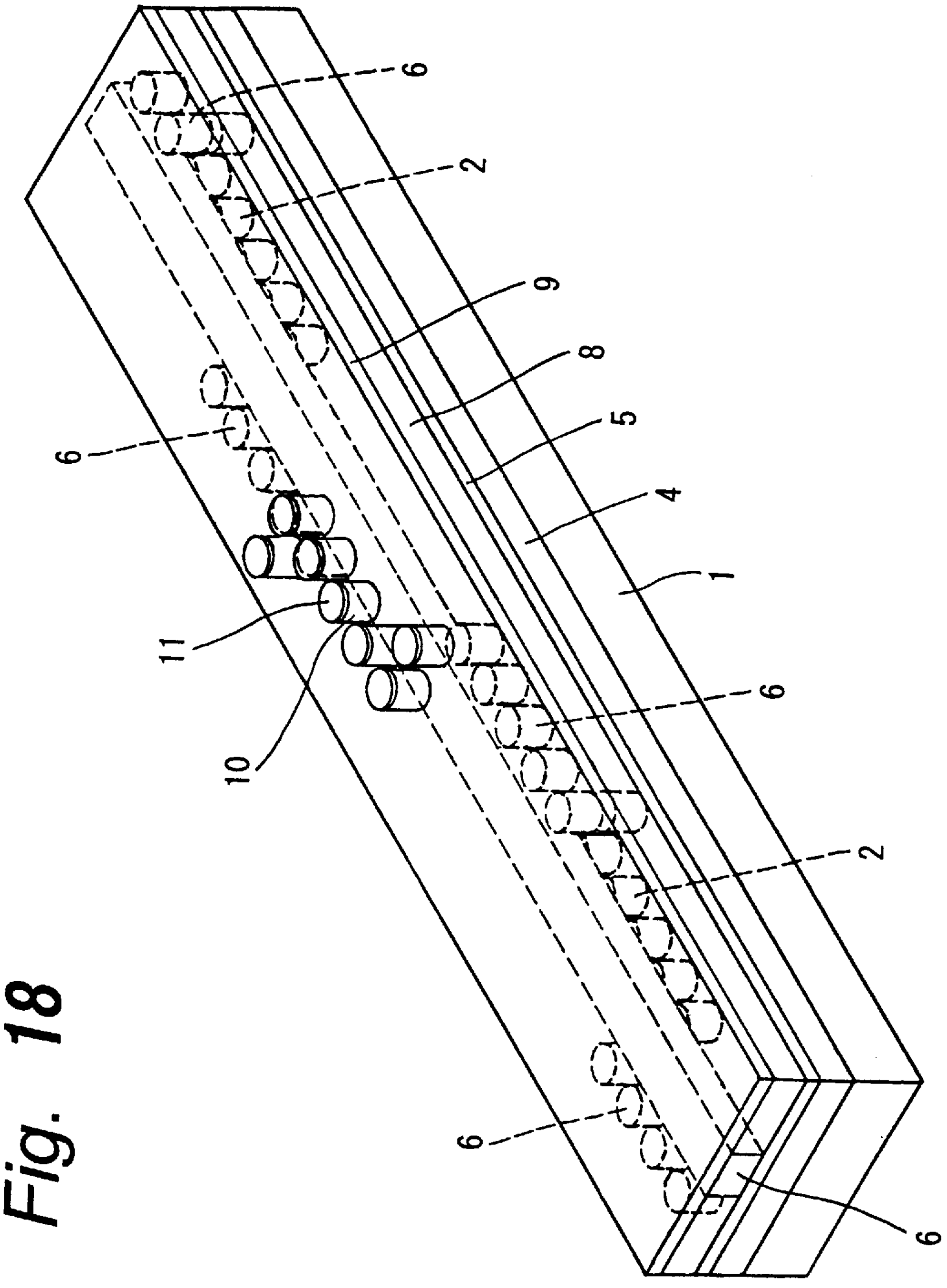
FIG. 18 is a perspective view for explaining the method for fabricating the charge transfer device according to the fourth embodiment of the invention.

By using the resist pattern 11 as a mask, the GaAs layer 10 is etched in the direction normal to the substrate surface by RIE, for example. If a chlorine-based gas is used as reactive gas in the etching by RIE, then the GaAs layer 10 can be selectively etched by using the AlGaAs layer 9 as an etching stop layer. As a result, the GaAs layer 10 is patterned into cylinders as shown in FIG. 18.

Figure 19:
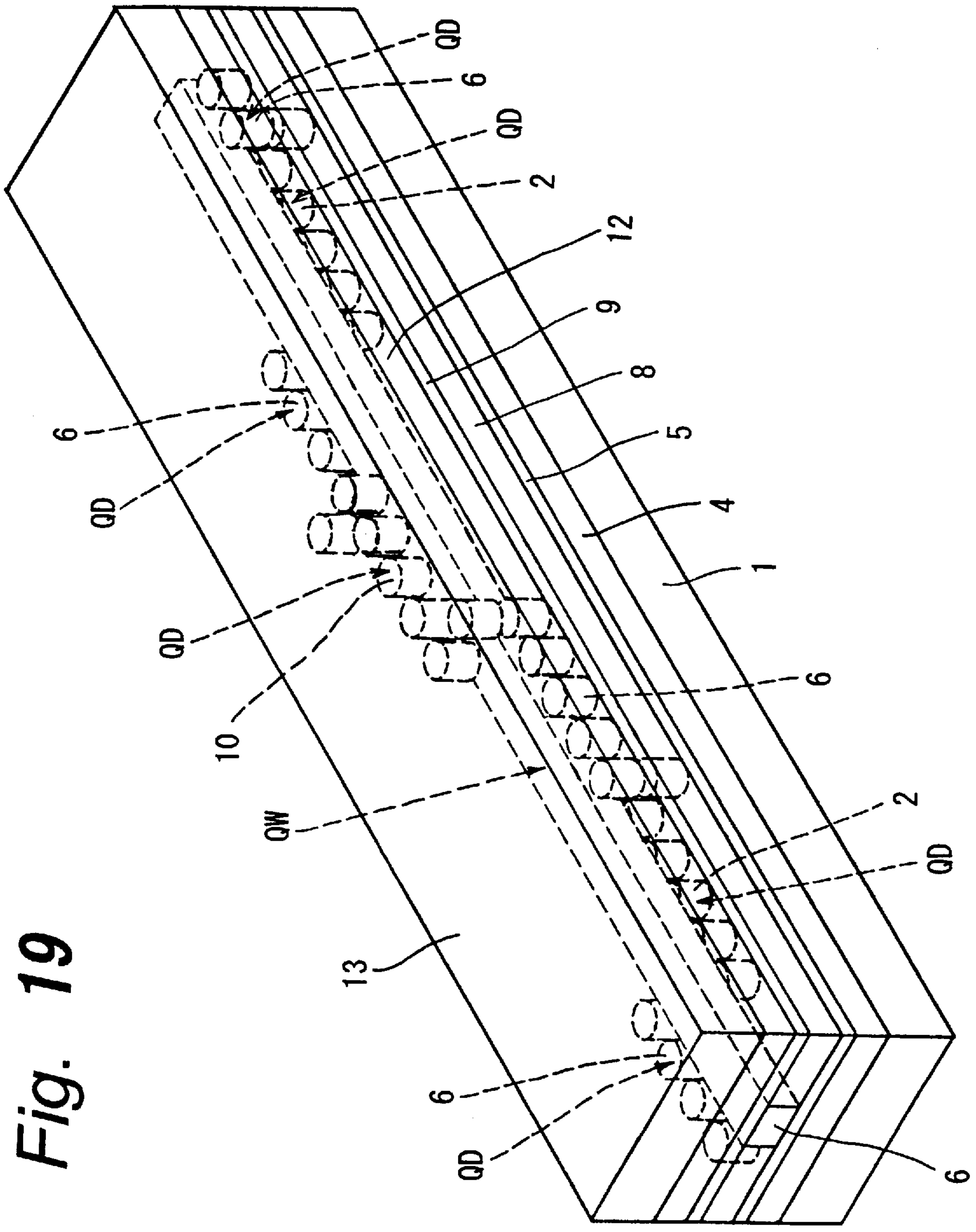
FIG. 19 is a perspective view for explaining the method for fabricating the charge transfer device according to the fourth embodiment of the invention.

Next formed an AlGaAs layer 12 by epitaxial growth using MOCVD, for example, so as to fill the portion removed by the etching, as shown in FIG. 19. Then the resist pattern 11 is removed. After that, an AlGaAs layer 13 is epitaxially grown on the entire surface by MOCVD, for example. The thickness of the AlGaAs layer 13 is about 50 nm, for example.

In FIG. 19, each quantum dots QD in the first stage comprises the cylindrical GaAs layer 2 enclosed by the AlGaAs substrate 1, AlGaAs layer 4 and AlGaAs layer 5, each quantum dot QD in the second stage comprises the cylindrical GaAs layer 6 enclosed by the AlGaAs layer 5, AlGaAs layer 8 and AlGaAs layer 9, and each quantum dot QD in the third stage comprises the cylindrical GaAs layer 10 enclosed by the AlGaAs layer 9, AlGaAs layer 12 and AlGaAs layer 13. Then the one-dimensional dot array comprises the quantum dots QD in these three stages. The elongated quadrangular-prismatic GaAs layer 6 enclosed by the AlGaAs layer 5, AlGaAs layer 8 and AlGaAs layer 9 forms the quantum wire QW.

By the process explained above, the charge transfer device according to the fourth embodiment can be fabricated easily, which has the same structure as that of the charge transfer device according to the third embodiment except for the cylindrical shape of each quantum dot QD and the opposite winding direction of the one-dimensional quantum dot array around the quantum wire QW.

Figure 20A:
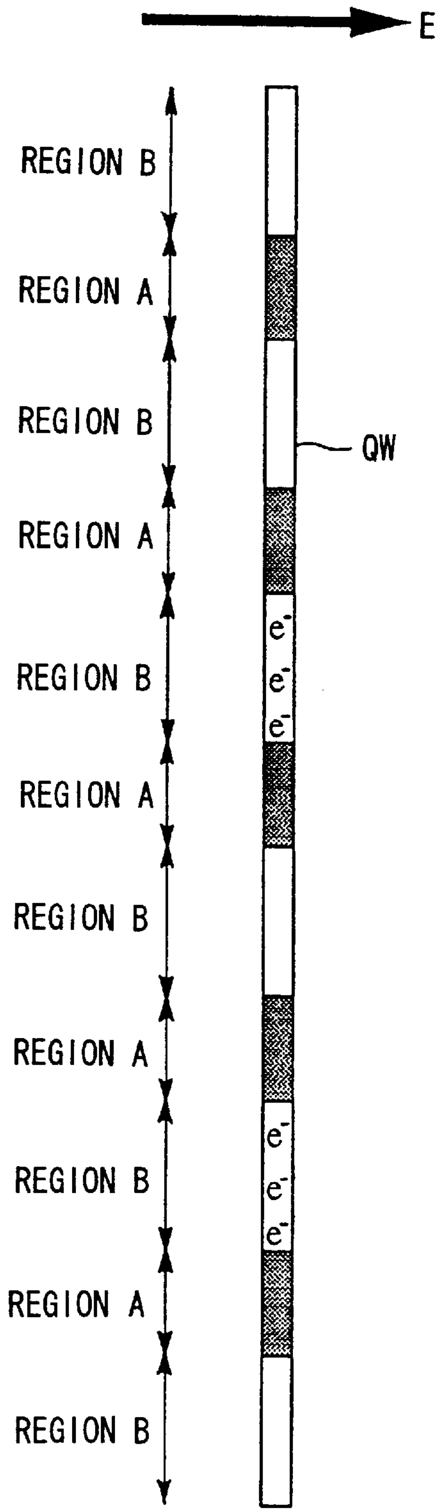
FIGS. 20A and 20B are schematic views for explaining transfer of charges along a quantum wire QW caused by rotation of an external field E within an x-y plane.
Figure 20B:
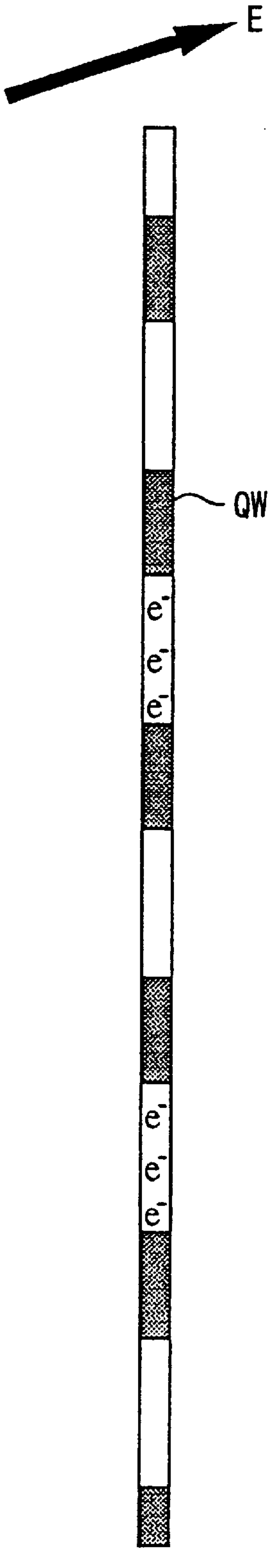

As understood from the detailed description of the first to fourth embodiments, parallel movement of charges along the quantum wire QW, i.e. in the z-direction direction, is possible as shown in FIGS. 20A and 20B by rotation of the external field E within the x-y plane for each quantum wire QW surrounded by the one-dimensional quantum dot array (not shown).

Thus explained below is a fifth embodiment using a plurality of quantum wires QW each surrounded by the one-dimensional quantum dot array to perform hyper-parallel transfer of charges.

Figure 21:
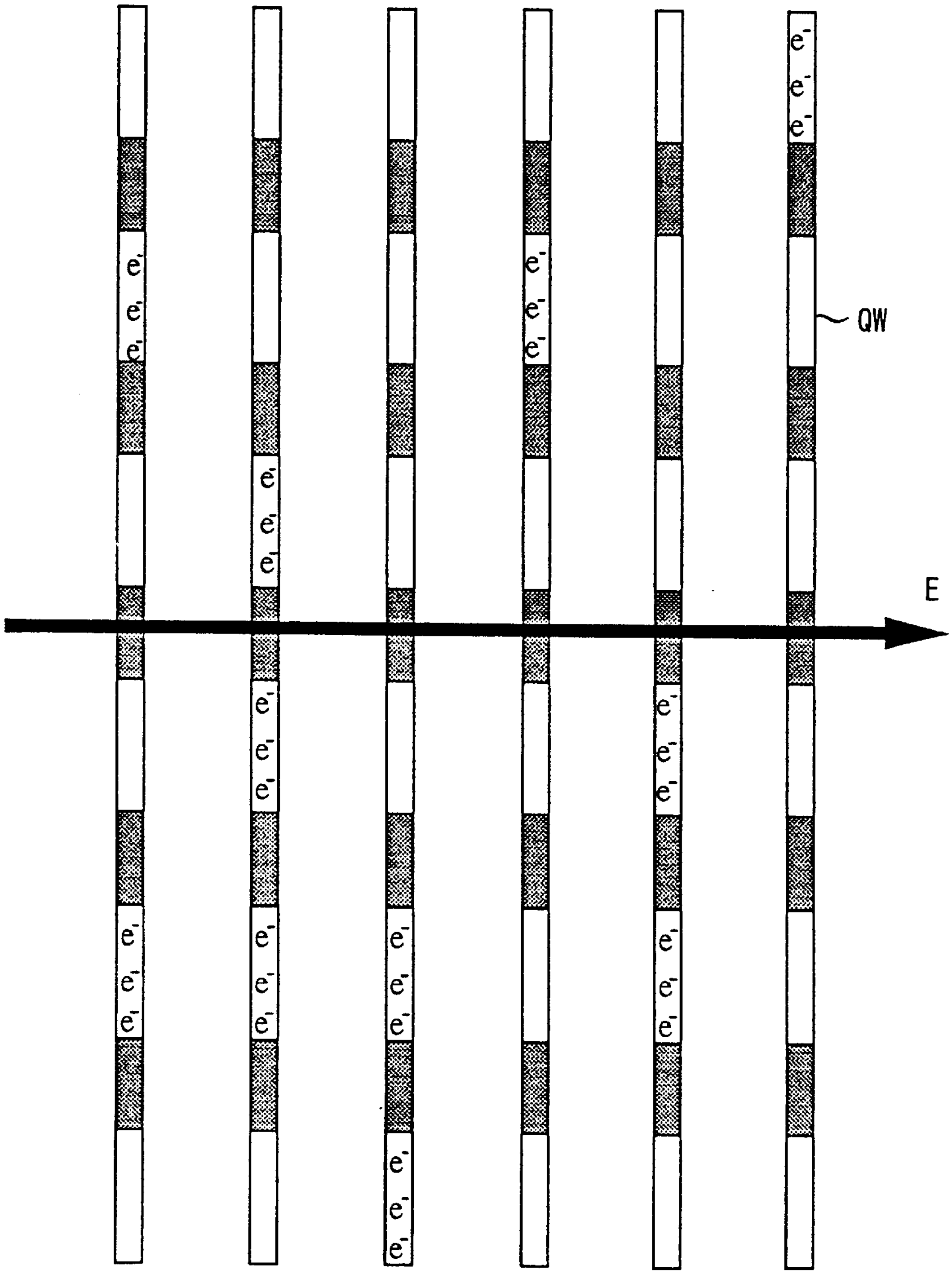
FIG. 21 is a schematic view illustrating a charge transfer device according to a fifth embodiment of the invention.

FIG. 21 is a charge transfer device according to the fifth embodiment.

As shown in FIG. 21, the charge transfer device according to the fifth embodiment includes a plurality of quantum wires QW which are extended in the z-direction direction, apart from and in parallel with each other, and each surrounded by a one-dimensional quantum dot array (not shown).

In the fifth embodiment, charges can be transferred in hyper-parallel along a respective quantum wire QW by applying the external field E within the x-y plane to the quantum wire QW and by rotating the direction of application of the external field E within the x-y plane. In this case, if the one-dimensional quantum dot array surrounding an arbitrary quantum wire QW is configured to wind in the opposite direction from that of the one-dimensional quantum dot arrays surrounding the other quantum wires QW, then it is possible to transfer charges along the former quantum wire QW in the opposite direction from that of charges transferring along the latter quantum wires QW. Additionally, if the one-dimensional quantum dot arrays are helical, then it is possible to change the moving distance of charges during one rotation of the external field E within the x-y plane can be varied among quantum wires QW by varying the helical pitch among the quantum wires QW.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For example, although the fourth embodiment was described as using MOCVD for epitaxial growth of respective layers of the charge transfer device, epitaxial growth may be performed by molecular beam epitaxy (MBE), for example.

In the first to fifth embodiments, if distribution of charges in the quantum wire QW is translated to a bit, the charge transfer device can be used as large-scale memory.

As described above, according to the invention, by providing at least one wire permitting charges to transfer along its extending direction and a helical one-dimensional quantum dot array encircling the quantum wire and extending from one lengthwise end to the other of the wire, and by applying an external field within a plane extending across the lengthwise direction of the wire and rotating the direction of application of the external field within the plane, charges can be transferred along the wire without using metal wiring.

What is claimed is:

1. A charge transfer device comprising:

at least one wire which permits charges to transfer along the lengthwise direction thereof; and a one-dimensional quantum boxes array helically extending around said wire from one lengthwise end to the other of said wire, wherein charges are transferred along said wire by applying an external field within a plane extending across the lengthwise direction of said wire and by rotating the direction of application of said external field within said plane.

2. The charge transfer device according to claim 1, wherein said one-dimensional quantum boxes array include quantum boxes satisfying $\theta_p \neq \theta_q$ when the center axis of said wire lies on the z-axis of the cylindrical coordinate system (r, θ, z) and arbitrary one of quantum boxes constructing said one-dimensional boxes array has its center at $(r_n, \theta_n, z_n)$ .

3. The charge transfer device according to claim 2, wherein said one-dimensional quantum boxes array lies on a helical line expressed by Equation $\theta_n = \xi z_n$ (where ξ is a constant) when the center axis of said wire lies on the z-axis of the cylindrical coordinate system (r, θ, z) and arbitrary one of said quantum boxes constructing said one-dimensional quantum boxes array has its center at $(r_n, \theta_n, z_n)$.

4. The charge transfer device according to claim 2, wherein said one-dimensional quantum boxes array includes quantum boxes satisfying $\theta_n = a_1$ $(0 \leqq n < m_1)$, $\theta_n = a_n$ $(m_1 \leqq n < m_2)$, et seq. (where $a_1$, $a_2$, et seq. are constants) when the center axis of said wire lies on the z-axis of the cylindrical coordinate system (r, θ, z) and arbitrary one of said quantum boxes constructing said one-dimensional quantum boxes array has its center at $(r_n, \theta_n, z_n)$.

5. The charge transfer device according to claim 3, wherein a plurality of said wires each surrounded by said one-dimensional quantum boxes array are provided in parallel to each other.

6. The charge transfer device according to claim 1, wherein a barrier layer lies between said wire and said one-dimensional quantum boxes array.

7. The charge transfer device according to claim 1, wherein no barrier layer is interposed between said wire and said one-dimensional quantum boxes array.

8. The charge transfer device according to claim 1, wherein said wire is a quantum wire.

9. The charge transfer device according to claim 1, wherein said wire is a one-dimensional quantum boxes array.

10. The charge transfer device according to claim 1, wherein said one-dimensional quantum boxes array is made of GaAs.

11. The charge transfer device according to claim 6 wherein said barrier layer is made of AlGaAs.

12. A charge transfer device comprising:

at least one wire which permits charges to transfer in the lengthwise direction thereof; and a one-dimensional quantum boxes array extending around said wire from one lengthwise end to the other of said wire;

wherein in response to application of an external field within a plane extending across the lengthwise direction of said wire, charges in said wire are transferred to a first region in said one-dimensional quantum boxes array opposite from the direction of application of said external field, charges being further generated in a second region of said wire from which charges are not transferred, said external field being rotated within said plane such that charges in quantum boxes in said first region of said one-dimensional quantum boxes array are transferred to other quantum boxes in said one-dimensional quantum boxes array, which are contiguous to said quantum boxes in said first region, and charges in said wire are transferred in the lengthwise direction of said wire.

13. The charge transfer device according to claim 12 wherein said quantum boxes are made to helically encircling said wire, and a first region containing charges and a second region not containing charges appear alternately in said wire after charges are transferred from said wire to said quantum boxes in said first region.

* * * * *